United States Patent
Yuan et al.

(10) Patent No.: US 6,281,075 B1
(45) Date of Patent: Aug. 28, 2001

(54) METHOD OF CONTROLLING OF FLOATING GATE OXIDE GROWTH BY USE OF AN OXYGEN BARRIER

(75) Inventors: Jack H. Yuan, Cupertino; Eliyahou Harari, Los Gatos, both of CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/239,073

(22) Filed: Jan. 27, 1999

(51) Int. Cl.[7] ................................................. H01L 21/336
(52) U.S. Cl. ............................................. 438/257; 438/239
(58) Field of Search ...................................... 438/257, 259

(56) References Cited

U.S. PATENT DOCUMENTS

| | | | |
|---|---|---|---|
| 4,583,281 | * 4/1986 | Ghezzo et al. | 29/576 |
| 5,043,940 | 8/1991 | Harari | 365/168 |
| 5,070,032 | 12/1991 | Yuan et al. | 438/267 |
| 5,095,344 | 3/1992 | Harari | 257/328 |
| 5,163,021 | 11/1992 | Mehrotra et al. | 365/185.03 |
| 5,172,338 | 12/1992 | Mehrotra et al. | 365/185.03 |
| 5,343,063 | 8/1994 | Yuan et al. | 257/317 |
| 5,554,553 | 9/1996 | Harari | 438/264 |
| 5,579,259 | 11/1996 | Samachisa et al. | 365/185.14 |
| 5,627,395 | * 5/1997 | Witek et al. | 257/350 |
| 5,661,053 | 8/1997 | Yuan | 438/257 |
| 5,712,179 | 1/1998 | Yuan | 438/588 |
| 5,867,429 | * 2/1999 | Chen et al. | 365/185.33 |
| 5,991,517 | * 11/1999 | Harari et al. | 395/182.01 |

* cited by examiner

Primary Examiner—Wael Fahmy, Jr.
Assistant Examiner—William M. Brewster
(74) Attorney, Agent, or Firm—Skjerven Morrill MacPherson LLP

(57) ABSTRACT

When more than one bit of data are being stored in each memory cell of a flash EEPROM, more than two ranges (states) of some parameter such as cell current are defined. Since all such ranges must be fit into an available total range that is finite, an increased number of individual ranges results in the extent of each range being made smaller. Writing into and reading from these narrower ranges must then be more accurate and reproducible. One factor that limits such accuracy and reproducibility is an increased growth during manufacture of the floating gate oxide along edges exposed from under the floating gates. This undesired increase floating gate oxide thickness is at least significantly inhibited by forming a dielectric oxygen barrier along the floating gates to shield the gate oxide layers under them from the effects of subsequent oxidation steps performed in the course of manufacturing the integrated circuit.

2 Claims, 8 Drawing Sheets

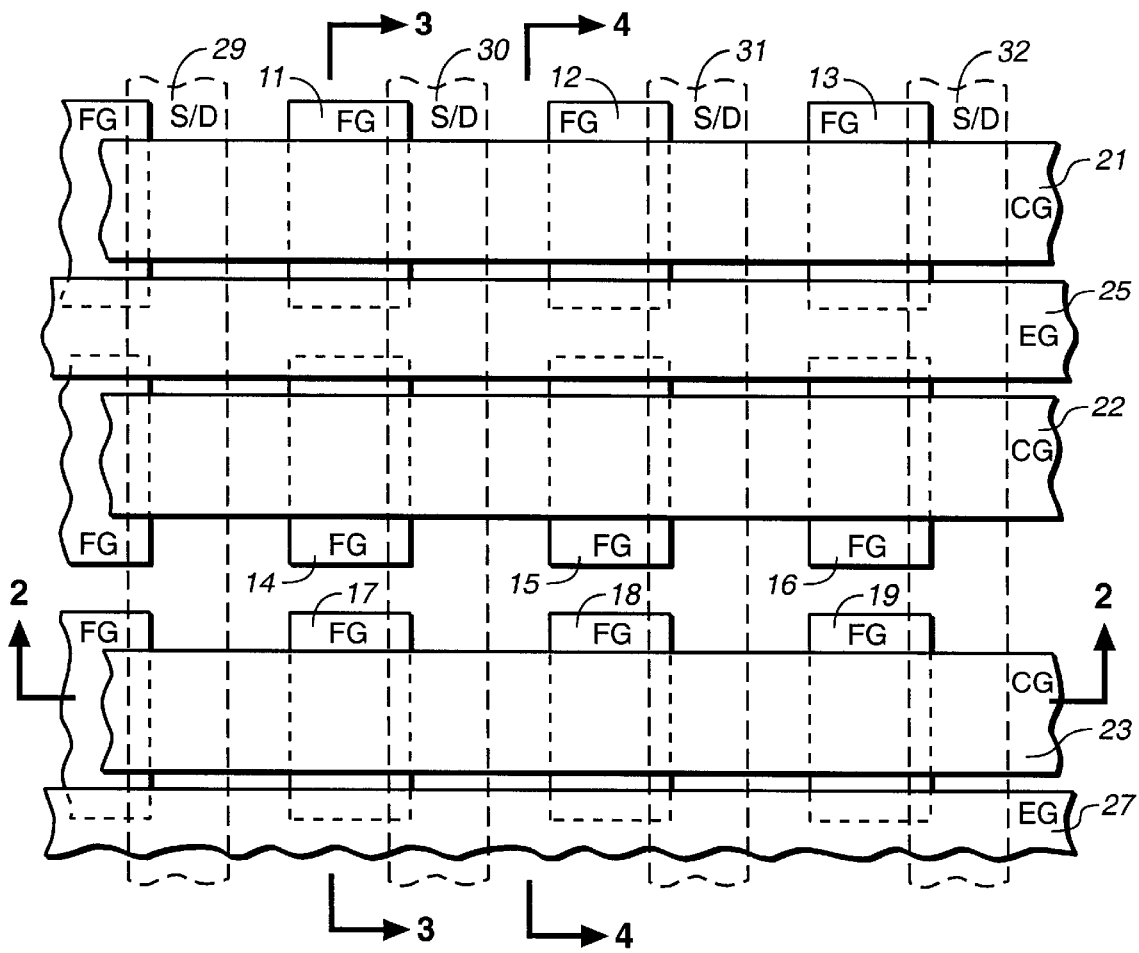
FIG._1
(PRIOR ART)

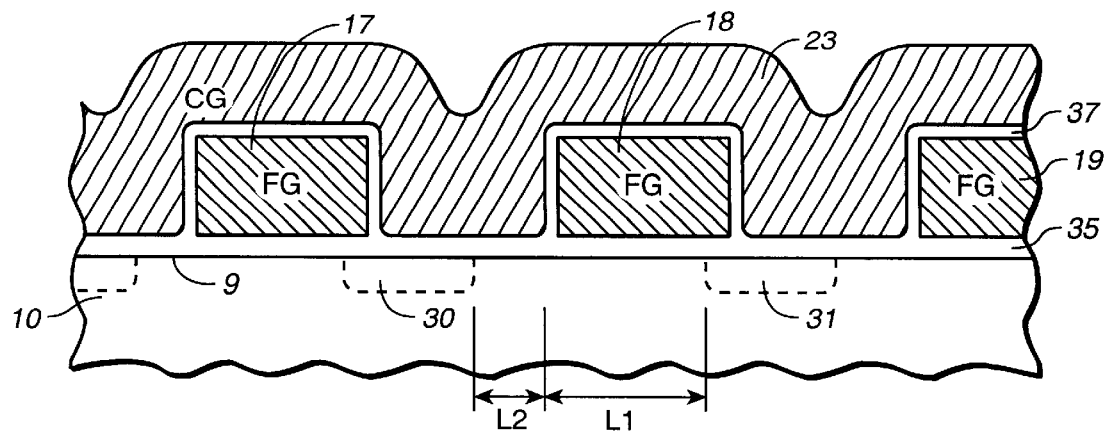
FIG._2
*(PRIOR ART)*
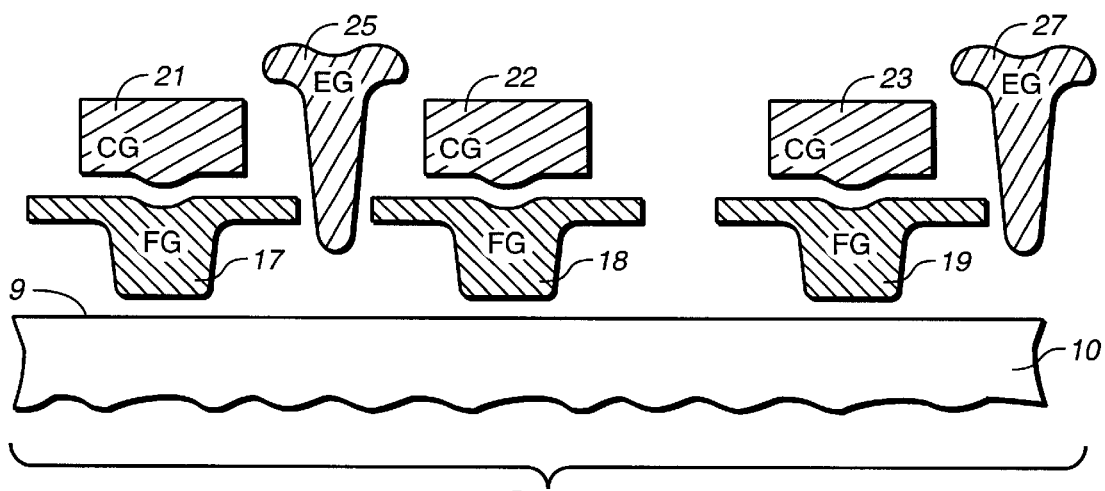
FIG._3
*(PRIOR ART)*

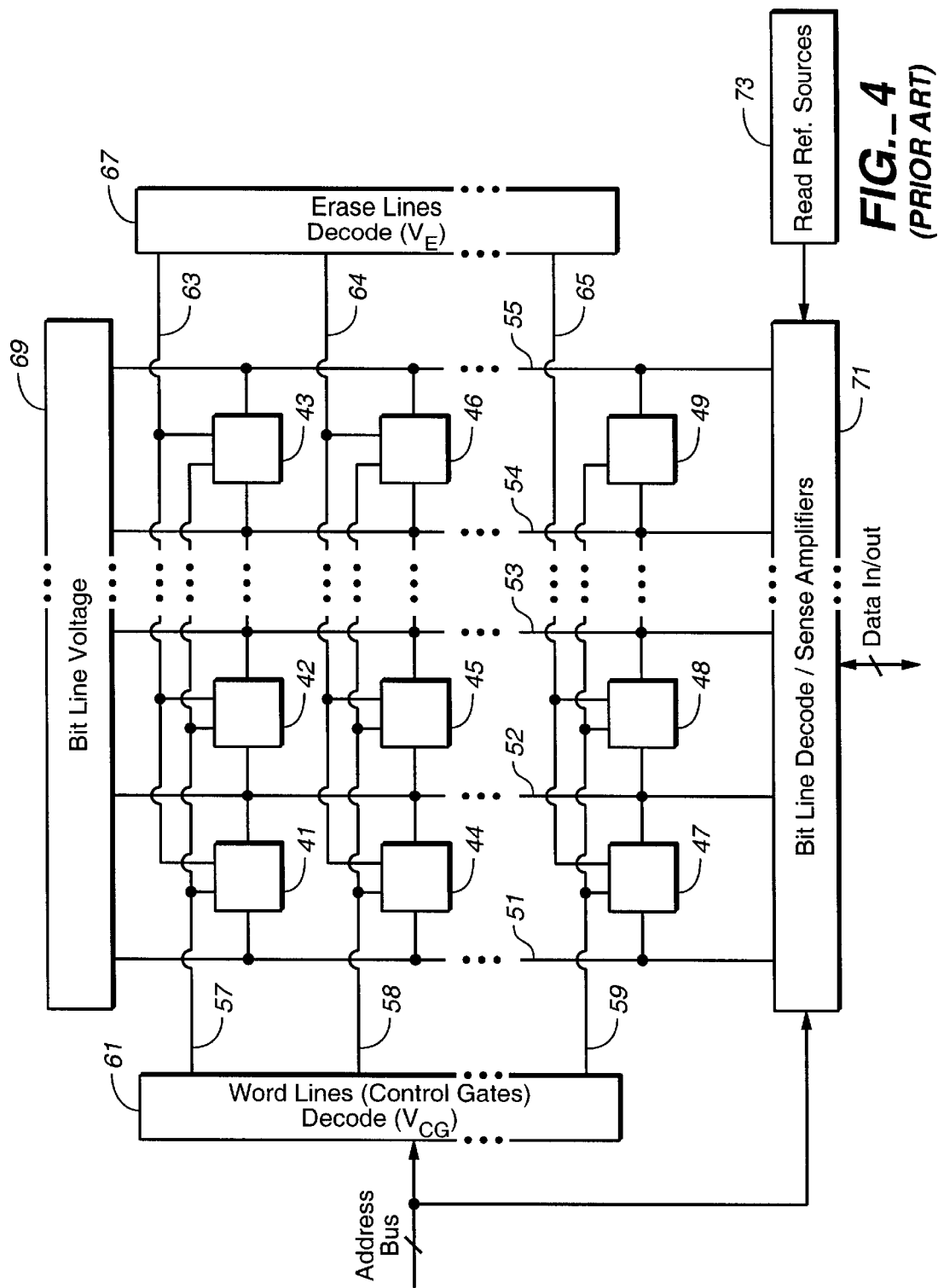
FIG._4 (PRIOR ART)

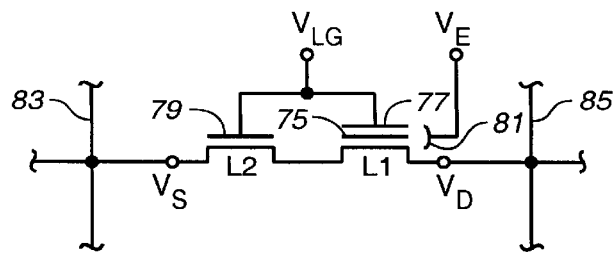
FIG._5
*(PRIOR ART)*
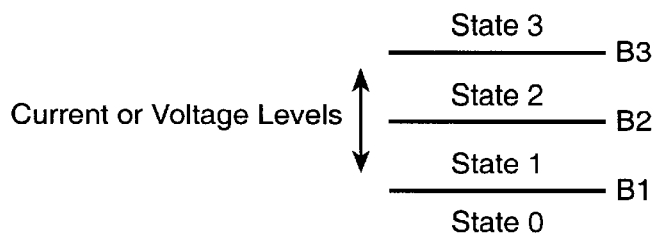
FIG._6
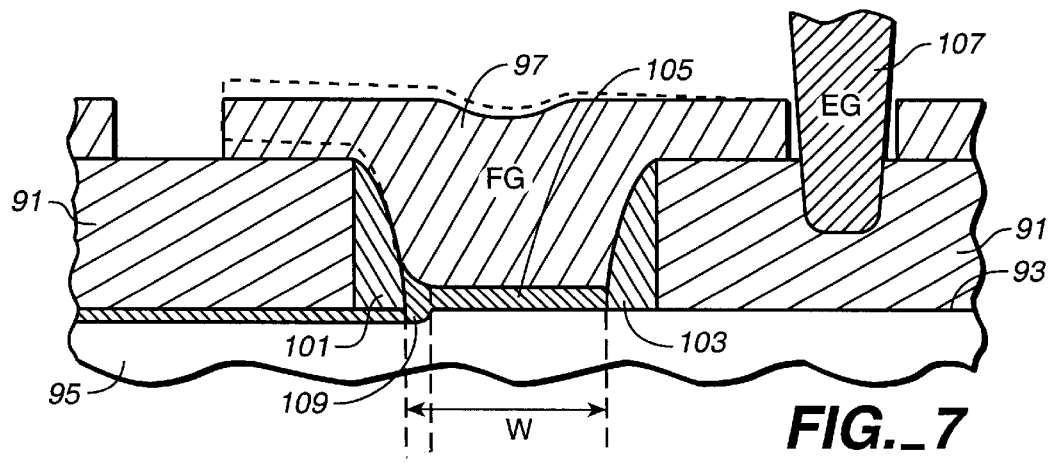
FIG._7
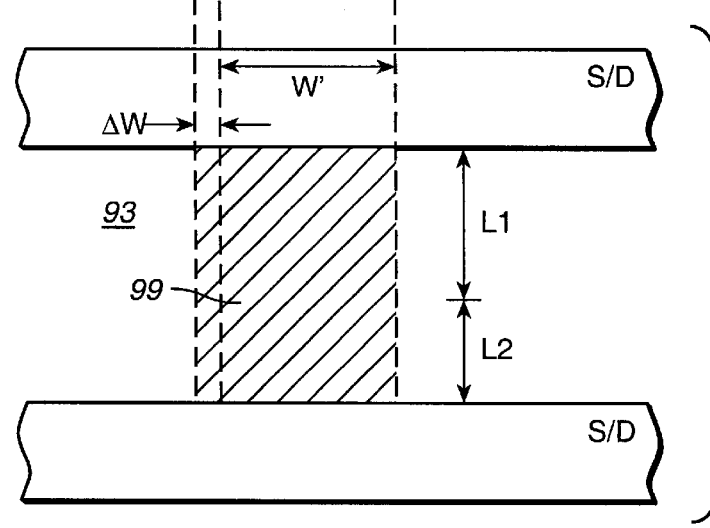
FIG._8

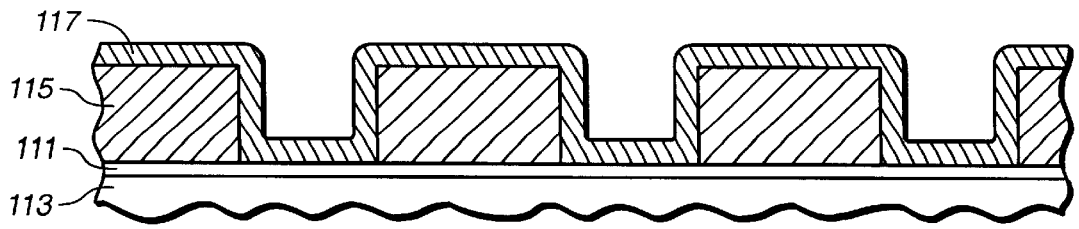
FIG._9A
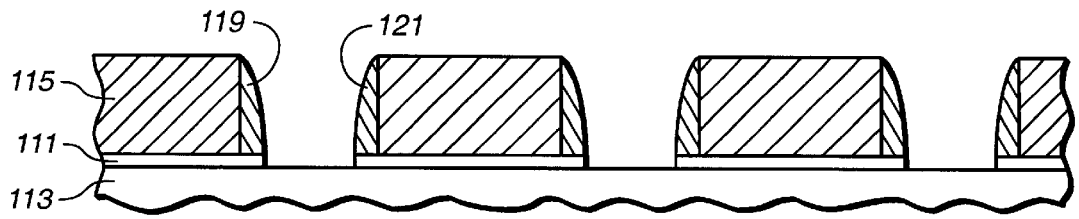
FIG._9B
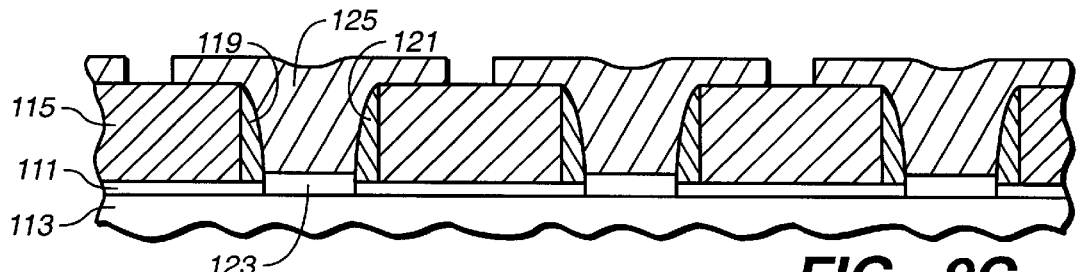
FIG._9C
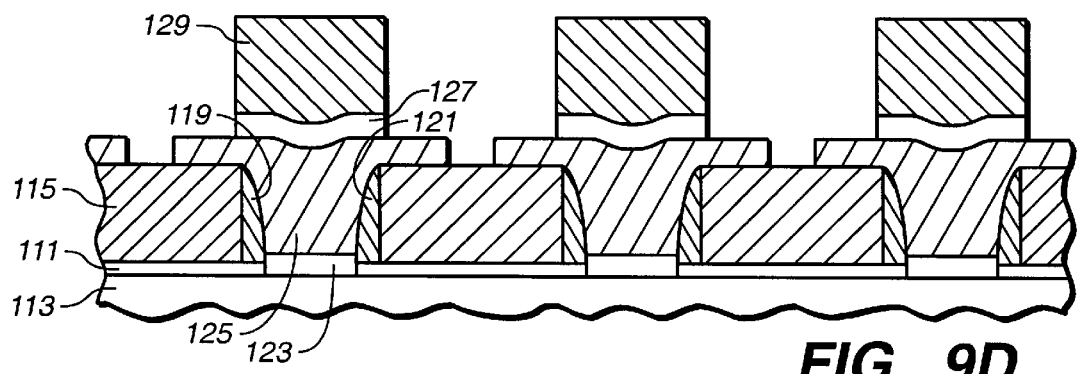
FIG._9D
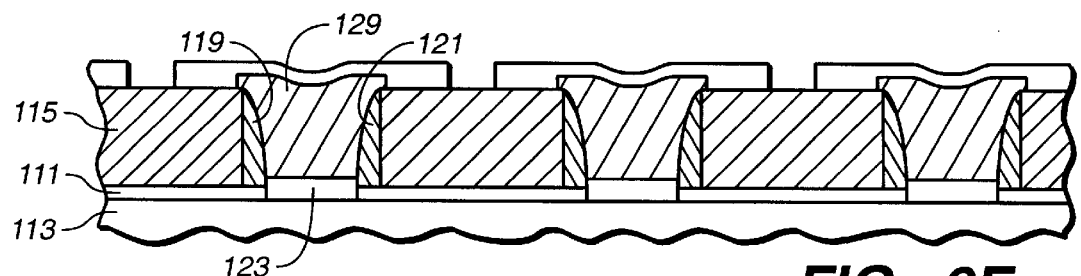
FIG._9E

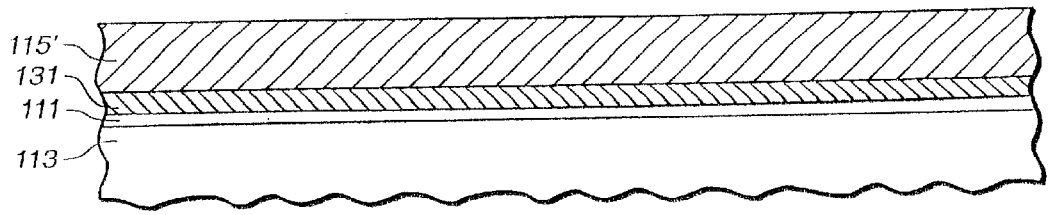
FIG._10A
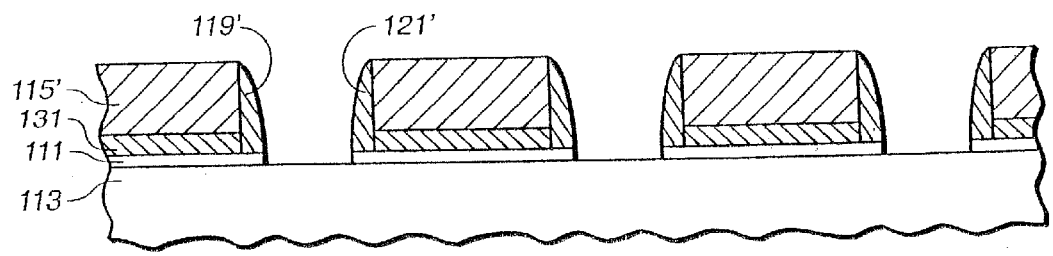
FIG._10B
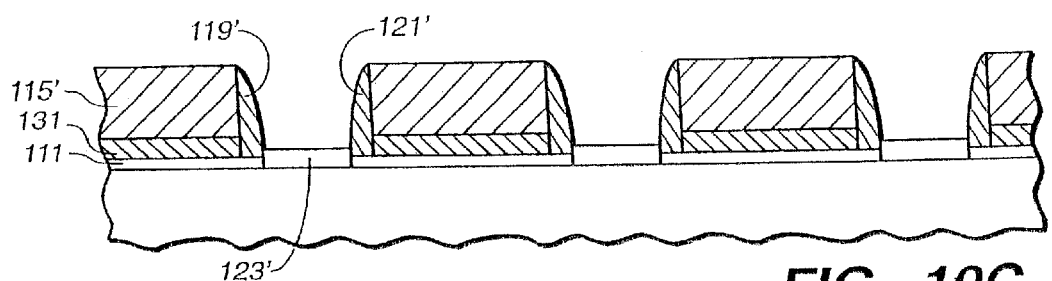
FIG._10C
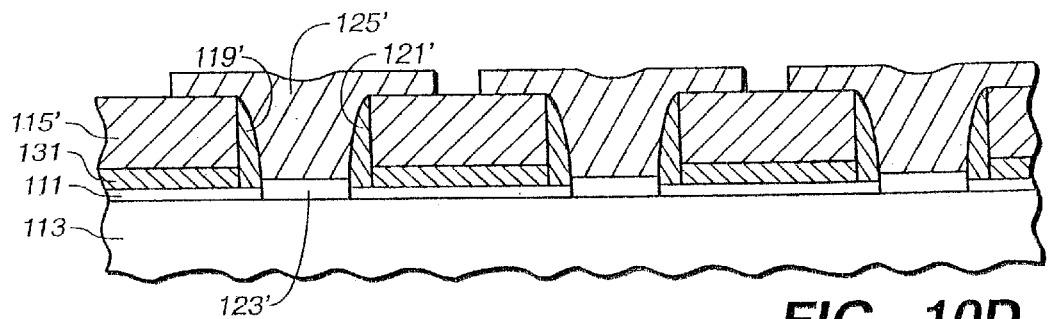
FIG._10D

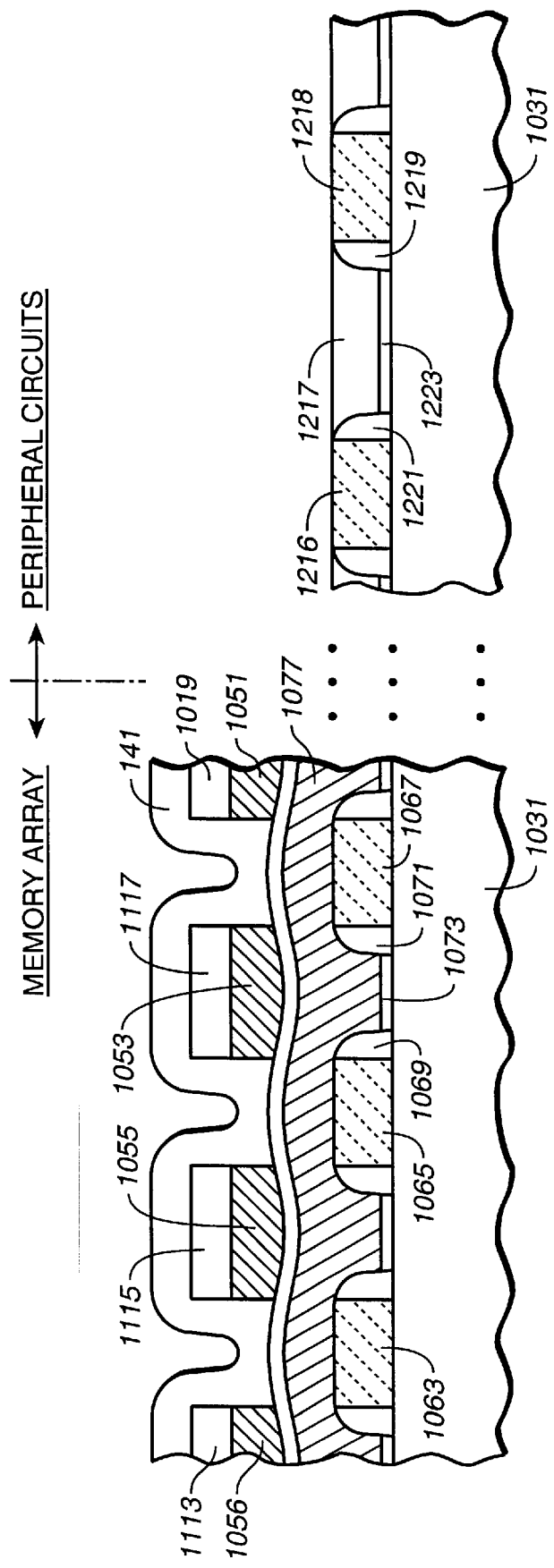
FIG._11

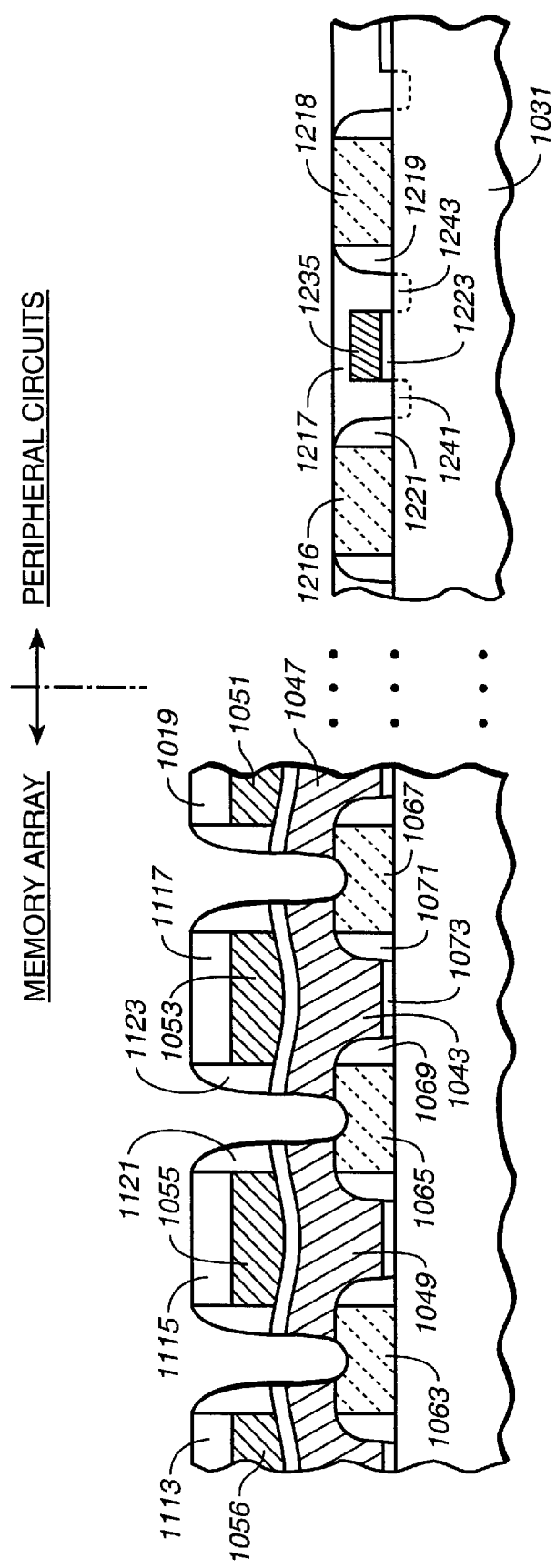
FIG._12

METHOD OF CONTROLLING OF FLOATING GATE OXIDE GROWTH BY USE OF AN OXYGEN BARRIER

BACKGROUND OF THE INVENTION

This invention relates generally to flash EEPROM system integrated circuits, and, more specifically, to techniques for controlling the making such circuits that improve the accuracy and reproducibility of the circuit structures and their operation.

As is well known, flash EEPROM systems provide non-volatile storage of data in memory cells formed of a field effect transistor which individually have an electrically isolated floating gate, a control gate and source and drain implants in the substrate. The cell is programmed by injecting a controlled amount of charge onto the floating gate. The cell is later read by application of an appropriate set of voltages to the control gate, source and drain, and then by monitoring some parameter that varies in relation to the amount of charge on the floating gate. This parameter is usually the amount of current flowing through the cell for fixed voltages on the control gate, source and drain, but can be some other parameter such as the amount control gate voltage that causes the cell to conduct some defined level of current. Example disclosures of these techniques are found in U.S. Pat. Nos. 5,095,344, 5,172,338, and copending patent application Ser. No. 08/910,947, filed Aug. 7, 1997, entitled "Novel Multi-State Memory," each of which is incorporated herein by this reference.

A typical flash EEPROM includes an array of floating gates positioned across a semiconductor substrate over a channel region between adjacent source and drain implants. The floating gate extends over the entire length of the channel in one type of device, and over only a portion of it in another type. In this later type, the control gate is positioned over the remaining length of the channel to form a select transistor in series with the floating gate transistor, a "split-channel" type of device. In either case, the array is constructed by forming various gate and field dielectric layers across appropriate regions of the substrate, a first polysilicon layer that is separated to become the floating gate array and a second polysilicon layer for the control gates, in a large number of individual steps necessitated by the complex nature of the structures. Examples of such structures and manufacturing techniques are given in U.S. Pat. Nos. 5,070,032, 5,343,063, 5,554,553, 5,661,053, 5,579,259 and 5,712,179, each of which is incorporated herein by this reference.

In order to store binary data, a majority of flash EEPROM systems divide the monitored parameter into two ranges separated by a single breakpoint level. Each cell then stores one bit of data. A cell is programmed into one of the two ranges by injecting charge onto the floating gate until it is verified, as part of the programming process, that the cell has been programmed into the desired range. More recently, in order to increase the density of data stored in a flash EEPROM, more that one bit of data is being stored in each cell by increasing the number of ranges of the monitored parameter to something above two. For example, one product uses four ranges, established by defining three breakpoint levels of the monitored parameter, to store two bits of data per cell. Example disclosures of such multi-state systems include U.S. Pat. Nos. 5,043,940 and 5,163,021, which are incorporated herein by this reference. An important goal of current flash EEPROM development efforts is to further increase the number of discrete states into which each cell can be programmed and thus read, in order to store more than two bits per cell. Eight distinct states, for example, allows three bits to be stored in each cell, sixteen states stores four bits per cell, and so on.

As the number of programmable states of each cell increases, however, the extent of each range becomes smaller. For example, if the monitored parameter is cell current, there is only a certain overall range of cell current in which the cell is operable, often termed an "operating window". As this window is divided into smaller and smaller parts, as the amount of data stored in each cell increases, the extent of each range necessarily becomes less. This then requires an increased accuracy and resolution in programming and reading the states of the cells. As a result, effort is being directed to more accurate programming and reading system operating techniques. An example is described in copending patent application Ser. No. 09/177,809, filed by Cernea et al. on Oct. 23, 1998, and entitled "Non-Volatile Memory with Improved Sensing and Method Therefor," now U.S. Pat. No. 6,044,019 which is incorporated herein by this reference.

It is a primary object of the present invention to provide improvements that allow a flash EEPROM integrated circuit system to be accurately and reproducibly operated with an increased number of storage states per cell.

It is a further object of the present invention to provide improved cell structures and manufacturing techniques.

SUMMARY OF THE INVENTION

These and additional objects are accomplished by the present invention, which includes the realization that a considerable portion of the inaccuracy and variability of operation between flash EEPROM cells on one chip, and those on different chips, that have created a limitation upon the number of programming states in which the cells may be operated, are due to changes in dimensions of certain elements that unintentionally occur as a result of processing steps taking place after formation of those elements. In particular, as a principal example, further growth of the floating gate oxide layers at their edges under the floating gates, which occurs as the result of subsequent oxidation steps used to grow other oxide layers and the like, causes the effective width of the cell channel to be decreased and thus change the operating characteristics of the cell from what is expected. Not only can this undesired decrease in channel width be different among cells on one chip, or between cells on different chips from wafers of different processing runs, its decrease causes other variabilities of the cell structure to take on greater significance in their operating characteristics. As another example, the further oxidation steps consume material on the sides of the polysilicon floating gate which can result in a narrowing of channel width, and of the control gate which, in the case of a split-channel cell, affects the width of the channel in the select transistor portion of the cell.

These unintended dimensional changes are significantly reduced, and can be eliminated altogether, as a result of the present invention, wherein barriers are formed to block oxygen from reaching the floating gate oxide and polysilicon gate walls during as many of the subsequent oxidation steps as practical, preferably all of them. The barrier is preferably formed from a dielectric material that is deposited in a normal manner. Silicon nitride is one such material. It also preferable that the oxygen barrier be provided by an element that already exists in an appropriate position of the structure, by simply changing the material to an oxygen blocking material, in order to avoid adding new processing steps.

In specific embodiments implementing the present invention, silicon nitride is used in place of field oxide and/or as the material used to form spacers that abut the floating gates and gate oxide underneath the floating gates. In an alternative embodiment, a silicon nitride layer is formed under the field oxide by adding at least one additional processing step.

In a further embodiment, a layer used to form dielectric spacers is made of an oxygen barrier material, such as silicon nitride. This layer is then left in place over the memory cell array portion of the chip during formation of peripheral circuits adjacent the memory array, at least during the step of growing gate oxide for the peripheral transistors. The oxygen barrier dielectric material layer is thereafter etched in a manner to leave the desired side wall spacers. It has been found that the peripheral transistor gate oxide growing step causes, by itself, much of the adverse effect on the memory cell gate oxide layers that is described above. This adverse effect is substantially eliminated by maintaining an oxygen barrier layer in place over partially formed memory cells during at least some processing of peripheral elements when it would otherwise normally be earlier removed in whole or in part to form the memory cell array.

Additional objects, advantages and features of the various aspects of the present invention are given in the following description of its preferred embodiments, which description should be read in conjunction with the accompanying drawings.

BRIEF DESCRIPTION OF THE DRAWINGS

FIG. 1 shows, in plan view, the primary elements of a few cells of an existing flash EEPROM array, as background;

FIG. 2 is a sectional view of FIG. 1, taken across section 2—2 thereof,

FIG. 3 is a sectional view of FIG. 1, taken across section 3—3 thereof,

FIG. 4 is a block schematic diagram of an existing flash EEPROM system utilizing the cell array of FIGS. 1–3, as background;

FIG. 5 is an equivalent circuit of one cell of the memory array and system of FIGS. 1–4;

FIG. 6 illustrates a specific operation of the memory system of FIGS. 1–5;

FIG. 7 is an enlarged cross-sectional view of one cell of the array of FIG. 1, as shown in FIG. 3 but with details added, that illustrates a problem solved by the present invention;

FIG. 8 shows the channel region of the memory cell of FIG. 8, in plan view;

FIGS. 9A–E show sequential processing steps that form a flash EEPROM array of the type illustrated in FIGS. 1–3 according to one embodiment of the present invention, FIGS. 10A–D show sequential processing steps that form a flash EEPROM array of the type illustrated in FIGS. 1–3 according to another embodiment of the present invention, and FIGS. 11 and 12 are cross-sectional views of a memory chip at two stages in its processing according to a further embodiment of the present invention.

DESCRIPTION OF THE PREFERRED EMBODIMENTS

The plan view of FIG. 1 shows one existing flash EEPROM array. Each cell in the array includes a floating gate. Floating gates 11–19 are shown in FIG. 1 arranged in rows and columns. Individual ones of control gates 21–23 extend along individual rows of floating gates. An erase gate 25 is positioned between control gates 21 and 22, and serves to erase the floating gates 11–16 on either side of it. Similarly, the erase gate 27 is coupled to erase the floating gates 17–19 and another row of floating gates, not shown. No erase gate is positioned between the control gates 22 and 23. Since each control gate serves two rows of floating gates, a control gate is positioned across the array between every other row of floating gates.

Source and drain diffusions 29–32 are elongated in the vertical direction of FIG. 1 and spaced apart in orthogonal direction across the width of FIG. 1. The control gates 21–23 and erase gates 25 and 27, on the other hand, are elongated in a direction across the width of FIG. 1 while being spaced apart in a vertical direction of FIG. 1.

FIGS. 2 and 3 show sectional views of FIG. 1 across Sections 2—2 and 3—3 thereof, respectively. The array is formed on a surface 9 of a semiconductor substrate 10, with the source and drain diffusions 29–32 resulting from ion implants into the surface 9 and subsequent diffusion. All of the floating, control and erase gates are made of conductively doped polysilicon material. A gate oxide layer 35 has been grown on the surface 9 of the substrate 10. Similarly, such a layer is formed between the control and floating gates, such as the gate dielectric layer 37 between the floating gate 19 and the control gate 23.

The type of memory cell chosen for illustration as background is the "split-channel" type but the improvements of the present invention are not limited for application to such a memory type. The split channel type is best illustrated in FIG. 2 where the floating gate 18 of one cell is shown to extend a portion L1 of the distance across the conduction channel of the device between adjacent source and drain diffusions 30 and 31. The amount of charge on the floating gate 18 thus controls the level of conduction in the L1 portion of the channel. A remaining length L2 of the channel is controlled by the control gate 23. As a result, only those cells having a voltage applied to its control gate to render the select transistor conductive will effectively be connected to adjacent source and drain diffusions, which form the memory bit lines. It is the amount of current flowing through an addressed cell between adjacent bit lines that is used in most existing systems to determine the amount of charge on its floating gate, and thus determining the state into which the cell has been programmed.

FIG. 4, as additional background, illustrates the use of the array of FIGS. 1–3 in a memory system. An array of memory cells 41–49 is shown organized in rows and columns, each cell containing one floating gate and the other elements illustrated with respect to FIGS. 1–3. Each cell is connected to those of bit lines 51–55 (source/drain diffusions) immediately on either side of it. The control gates of the cells in each row are connected together through respective word lines 57–59 to a word line decoder 61. Similarly, the erase gates of all memory cells in a row are connected together through respective conductors 63–65 to an erase line decoder 67. Pre-charge and other bit line voltage supply circuits 69 also exist. A block 71 generally shows circuits that address specific bit lines, including sense amplifiers for reading the state of an addressed cell in a particular column. In practice, the number of cells in different columns are written in parallel and also then read in parallel. In a typical system, the sense amplifiers individually detect the level of current flowing through the cells and compares those currents with a set of reference current sources 73. Details of such memory systems are provided in previously referenced patents that are incorporated into this disclosure.

In a schematic diagram of one of the memory cells of FIG. 4, as illustrated in FIG. 5, a floating gate 75 is positioned over the portion L1 of the device conduction channel in the substrate. A portion 77 of a control gate is electrically field coupled to the floating gate, while a portion 79 is field coupled with the remaining length L2 of the conduction channel in the substrate. An erase gate 81 is coupled through a thin layer of tunnel oxide to the floating gate 75. The series connection of transistors is connected between adjacent bit lines 83 and 85.

As an example of the operation of the memory system of FIGS. 1–5, in order to provide specific background in which to explain the present invention, the multiple states of each cell are detected by comparing current read through it with the reference current sources. This is illustrated in FIG. 6 where the maximum window of cell current is divided into four ranges of current, each of which represents a programmed state of the cell. A four-state operation is being illustrated. The ranges are separated by breakpoint levels B1, B2 and B3. It is these breakpoint reference currents which are generally supplied by the reference source 73 (FIG. 4) for comparison with the actual current being read from a cell. Alternatively, a voltage can be the parameter that is being detected but the principles of operation are the same. In either case, it is assumed that the voltages supplied to the bit lines and to the control gate of the addressed cell are constant while it is being read. An alternative technique, where the control gate is stepped through a voltage range to determine its voltage when the cell current reaches a certain level, also involves use of ranges of voltages such as illustrated in FIG. 6, with reference breakpoint levels instead of the current breakpoint levels previously described. Of course, only four states are illustrated in FIG. 6 and otherwise described herein, for simplicity, but the principles also apply to systems in which the operating window of the cells have been divided into more than four ranges.

As the operating window of the devices is divided into more and more ranges representing an increased number of programmable states, the memory operation, particularly during programming, must be performed with increased precision. The primary limitation of being able to go to an increased number of states has been the difficulty operate with such precision in an acceptable amount of time. Although some improved precision has resulted from efforts to improve programming and reading techniques, there are other causes for the difficulty in precision operation that have not been fully understood.

It has been discovered as part of the present invention that certain dimensional changes of memory cell elements, that inadvertently result during processing, significantly increase the range of imprecision in operation of the memory cells. This has limited the number of states to which each cell can be programmed. One such important dimensional difference is illustrated in FIG. 7, which is a cross-sectional view of a memory cell formed by processes described in previous patents incorporated herein by reference. In those processes, a field oxide layer 91 is deposited across the surface 93 of a semiconductor substrate 95. Trenches are then etched into the field oxide to receive a first layer of polysilicon that eventually becomes individual floating gates, such as a floating gate 97. The width of the floating gate 97 in that trench defines the width "W" of the cell's conduction channel 99, as shown in the plan view of FIG. 8 that includes the substrate surface 93 under the floating gate 97.

The width W is carefully controlled by existing processes by forming oxide spacers 101 and 103 on opposite sides of the trench. These spacers are formed by depositing a layer of silicon dioxide over the entire structure and then isotopically etching that layer to remove all but the desired spacers, such as spacers 101 and 103. A thin layer of gate oxide 105 is then grown on the substrate surface 93 and the first layers of polysilicon deposited thereover. Subsequent steps include depositing a second layer of conductively doped polysilicon, which is then etched into control gates, followed by a third layer of conductively doped polysilicon which is separated into individual erase gates, such as erase gate 107. Although the invention is being described with respect to an example that utilizes separate erase gates, its principles are equally applicable to other types of structures that do not use erase gates but rather remove electrons from the floating gate to the semiconductor substrate.

It has been discovered that oxidation steps which occur during processing after the floating gate oxide 105 has been grown and the first polysilicon layer deposited over it, causes enough additional oxidation of edges of the floating gate oxide 105 to effectively change the width W of the cell's channel by and amount ΔW to a narrower width W', and that this makes it difficult to precisely operate the cell with a desired increased number of states. This is shown at one edge 109 of the gate oxide layer 105 in FIG. 7. The subsequent oxidation steps include those that grow additional oxide layers. It appears that oxygen migrates during those subsequent oxidation steps through the field oxide 91 to the edge 109 of the gate oxide layer 105 to cause that edge to continue to grow. In the course of such growth, part of the polysilicon of the floating gate 97 is consumed, as well as part of the substrate 95 under this edge. The result is that the floating gate edge is positioned a further distance from the substrate surface 93 than designed, the reduced field coupling caused by this change effectively narrowing the width W of the cell's conduction channel 99. This even results in a slight tip of the floating gate 97, as shown in FIG. 7 by a dashed line outline of the floating gate.

This increased floating gate thickness is shown on only one side 109 of the layer 105 of FIG. 7 since it has been found that the overlap of the floating gate 97 itself, and the existence of the erase gate 107 close to it, effectively shield the opposite side of the layer 105 from receiving oxygen during oxidation steps that occur after the erase gate 107 is formed. The increased oxidation of the floating gate layer 105 on its right hand side in FIG. 7 is then not nearly so severe.

Therefore, in order to prevent the floating gate oxide from becoming thicker along its edges, a barrier to the transmission of oxygen through the field oxide layer 91 is included in the structure. It is preferable that this oxygen barrier be installed before any oxidation steps occur after the floating gate oxide has been grown. There seems to be an advantage, however, to providing the barrier during any oxidation process, so, in some cases, one or more oxidation steps may be allowed to take place before the oxygen barrier is formed.

Referring to FIGS. 9A–E, one embodiment of a process to form such an oxygen barrier is explained. In this example, the oxygen barrier is put in place even before the floating gate oxide is grown, thereby assuring that no other oxidation steps will occur without the barrier in place. Referring to FIG. 9A, a thin layer 111 of oxide is grown on the surface of a silicon substrate 113. This is made to be from 50 to 200 Angstroms thick. In a next step, a rather thick layer 115 of field oxide is deposited over the layer 111. Trenches are then formed by etching into the field oxide 115, in a manner shown. After the trenches are formed, a layer 117 of silicon nitride is deposited for the purpose of forming spacers within the trenches. The use of silicon nitride material for the spacers provides a barrier to oxygen. A layer of from 50 to 200 Angstroms of silicon nitride is deposited in this way. An isotropic etch is then performed in order to remove all of the layer 117 from horizontal surfaces and leave spacers in the trenches, such as spacers 119 and 121, as shown in FIG. 9B.

Next, gate oxide is grown in the bottom of the trenches, such as a layer 123 that is made to be from 100 to 300 Angstroms in thickness. A first conductively doped polysilicon layer is then deposited across the surface and etched into strips that eventually become floating gates, such as the strip or gate 125. From this point on, the gate oxide layer 123 is sealed against receiving oxygen at its edges through the field oxide layer 115. Further growth of the gate oxide layer 123 is then prevented as the complicated flash EEPROM structure is completed. The effects described with respect to FIGS. 7 and 8 are thereby at least significantly reduced, or, more likely, eliminated.

Some further processing of the structure is shown in FIGS. 9D and 9E. An oxide layer 127 is grown on the first polysilicon in order to provide a dielectric between layers of polysilicon. After that, a second polysilicon layer 129 is deposited and the two of them are etched into control gate strips extending along rows of floating gates. Since the floating gate oxide layer 123 is sealed, the oxidation step involved in growing the oxide layer 127 does not cause the thickness of the floating gate oxide layer 123 to increase, as it has done heretofore.

All of FIGS. 9A–D show progression in the formation of the array along the section 3—3 of FIG. 1. FIG. 9E shows the device at section 4—4 of FIG. 1, in between floating gates, at the same stage of processing as shown in FIG. 9D. The control gate 129 is separated from the surface of the substrate 113 by the gate oxide layer 123. The silicon nitride spacers 119 and 121 prevent additional undesired oxidation of the gate layer 123 in this region as well. Further, the oxygen barrier provided by the spacers 1 19 and 121 prevent sides of the control gate 129 from being consumed by oxidation, and thus prevents the control gate from being narrowed in the region illustrated in FIG. 9E. This is also an advantage with respect to the floating gates, such as the floating gate 125 of FIG. 9D, but is not so critical in this specific example since outward extending flanges of the floating gate 125 provide some shield to its underlying side surfaces to subsequent oxidation. But other shapes of floating gates will cause their sides to be exposed more to the results of subsequent oxidation steps, in which case the oxygen barrier provided by the spacers is of considerable benefit in preventing.

Another form of an oxygen barrier is illustrated in the process steps of FIGS. 10A–D, where elements corresponding to the embodiment of FIGS. 9A–E are identified by the same reference number with a prime (') added. The difference in this embodiment is the deposition of a layer 131 of silicon nitride over the oxide layer 111 before the field oxide layer 115' is deposited. Subsequent steps illustrated in FIGS. 10B–D are similar to those described with respect to FIGS. 9B and 9C. The spacers 119' and 121' can either be normal silicon dioxide or, as in the case of the embodiment of FIGS. 9A–E, silicon nitride to provide even more of an oxygen barrier. As shown in FIGS. 10C and 10D, the silicon nitride layer 131 is made thick enough to extend above the gate oxide layer 123' in order to provide the desired barrier to migration of oxygen to it. A disadvantage of the embodiment described with respect to FIGS. 10A–D is that at least one additional processing step is necessary to form the oxygen barrier layer 113, while in the embodiment of FIGS. 9A–E the oxygen barrier is provided by simply changing the material used to form the spacers 119 and 121.

The field oxide layer 115 is typically deposited to a thickness from 1000 to 4000 Angstroms. As a third embodiment of the present invention, the field oxide can be replaced with silicon nitride of the same thickness. If the entire thickness of the field dielectric layer is made of a oxygen barrier material, the floating gate oxide is well protected against the undesired subsequent oxidation of its edges. The spacers, in this event, can either be made of silicon dioxide or silicon nitride.

A fourth embodiment of the present invention can best be explained as an improvement of one aspect of aforementioned U.S. Pat. No. 5,661,053 of Yuan, which is incorporated into this disclosure. The Yuan patent describes, with respect to its FIGS. 18–26, semiconductor processing techniques for forming both floating gate storage cells and transistors of peripheral circuits on the same chip. FIG. 11 of the present application shows an improved intermediate memory cell structure, in cross-section, at a stage of memory cell processing that is in between the stages shown in FIGS. 11C and 12C of the Yuan patent, along with a peripheral transistor from the Yuan patent FIGS. 21–23. Similarly, FIG. 12 of the present application illustrates the present improvement at a stage of memory cell processing that is in between the stages shown in FIGS. 12C and 13C of the Yuan patent, along with a peripheral transistor from the Yuan patent FIGS. 21–23. The peripheral transistors, such as employed in decoders and other supporting circuitry of a memory system, are being formed in part at the same time as the memory cell transistors. Since the reference numbers of elements of FIGS. 11 and 12 herein corresponding to those of the Yuan patent are the same as in the Yuan patent but with 1000 added to them, a repeat of the description of the structure common to both disclosures is omitted here for brevity.

The improvement of the present application is the deposition of a layer 141 (FIG. 11) of an oxygen barrier material, such as silicon nitride, to form spacers 121, 123, etc., along the sidewalls of control gate polysilicon strips 1053, 1055, etc. formed from the second polysilicon layer. Instead of forming the spacers from the layer 141 right after its deposition, as has been done previously, the layer 141 is maintained in place to protect the memory cell structures while at least the gate oxide 1223 is grown on the substrate 1031 as part of a peripheral transistor. This then protects the floating gate oxide layers 1073 from the further undesirable oxidation of the gate oxide layer 105 illustrated in FIGS. 7 and 8 herein. Such further memory cell floating gate oxidation, and thus its undesirable effects, have been found to be especially sensitive to a subsequent oxide growing step such as that which occurs to form transistor gate oxide layers as part of the peripheral circuits. But the oxygen barrier layer 141 deposited over the memory cells minimizes, if not prevents, this from occurring.

The layer 141 is not an extra layer that must then be removed in its entirety after the peripheral circuits are formed. Rather, after at least the gate oxide layer 1223 of the peripheral transistors is grown, the layer 141 is anisotropically etched to form spacers 1121, 1123, etc. (FIG. 12 herein) which remain as part of the memory cell structure. Use of the layer 141 as oxygen protection conveniently occurs after the second polysilicon layer has been patterned into control gate strips 1053, 1055, etc., because a normal next step is to form the spacers 1121, 1123, etc. In the present invention, the layer 141 that is deposited as part of forming the spacers is maintained in place to protect the floating gate oxide layers 1073 etc. from further undesired oxidation during a subsequent oxidation step performed to grow the peripheral transistor gate oxide layers 1223 etc. After the peripheral gate oxide is grown and the layer 141 then etched to leave the spacers in the memory cells, the peripheral circuit areas are then covered and further processing takes place of the memory cells, such as shown in FIG. 12 herein and FIG. 13C of the Yuan patent.

Although the present invention has been described with respect to its preferred embodiments, it will be understood that the invention is entitled to protection within the full scope of the appended claims.

It is claimed:

1. A method of making a flash EEPROM system on an integrated circuit substrate, comprising:

forming parallel source and drain regions in the substrate that are elongated in a first direction and spaced apart in a second direction that is orthogonal to the first direction, oxidizing a first exposed surface area of the substrate to grow a layer of floating gate oxide thereon, depositing on the gate oxide a conductive material to form an array of memory cell floating gates that individually extend at least a portion of the space between the source and drain regions in said second direction, depositing a layer of dielectric material over the floating gate array in a manner to present a barrier to oxygen migration to the gate oxide as the structure is oxidized during subsequent processing, oxidizing a second exposed surface of the substrate adjacent the floating gate array to grow a layer of gate oxide of peripheral transistors with the dielectric barrier layer in place, thereby preventing further growth of the floating gate oxide while the peripheral transistor gate oxide is being grown, and thereafter removing a majority of the oxygen barrier layer by anisotropically etching said layer in a manner that leaves a portion of the layer as dielectric spacers along edges of the memory cells.

2. The method of claim 1, the peripheral transistors in part form a circuit that monitors an effect of a level of charge stored on individual ones of the floating gates upon an electrical parameter with respect to more than two defined ranges of the parameter including at least two breakpoint levels, thereby storing more than one bit of data per memory cell floating gate, whereby the effect of the charge on the electrical parameter is altered by any further growth of the floating gate oxide subsequent to depositing conductive material thereover.

\* \* \* \* \*